United States Patent
Sethi et al.

(10) Patent No.: US 8,959,419 B1
(45) Date of Patent: Feb. 17, 2015

(54) VITERBI ARCHITECTURE FOR BDR/BLE

(71) Applicant: Marvell International Ltd., Hamilton (BM)

(72) Inventors: Ankit Sethi, Pune (IN); Swaroop Venkatesh, Dublin, CA (US); Rohit U. Nabar, Sunnyvale, CA (US); Vijay Ahirwar, Bhopal (IN)

(73) Assignee: Marvell International Ltd., Hamilton (BM)

( * ) Notice: Subject to any disclaimer, the term of this patent is extended or adjusted under 35 U.S.C. 154(b) by 83 days.

(21) Appl. No.: 13/719,810

(22) Filed: Dec. 19, 2012

Related U.S. Application Data

(60) Provisional application No. 61/578,180, filed on Dec. 20, 2011.

(51) Int. Cl.
*H03M 13/03* (2006.01)
*H04L 1/00* (2006.01)

(52) U.S. Cl.
CPC ................... *H04L 1/0054* (2013.01)
USPC ........................................................ 714/795

(58) Field of Classification Search
CPC ............ H03M 13/41; H03M 13/4107; H03M 13/6502; H03M 13/3961; G11B 20/10009
USPC ......................................................... 714/795
See application file for complete search history.

(56) References Cited

U.S. PATENT DOCUMENTS

| | | | | |
|---|---|---|---|---|
| 7,426,249 | B2 * | 9/2008 | Keaney et al. ................ | 375/341 |
| 7,924,932 | B2 * | 4/2011 | Thomson et al. ............. | 375/260 |
| 8,009,773 | B1 * | 8/2011 | Kankipati et al. ............ | 375/341 |
| 8,397,148 | B2 * | 3/2013 | Shi et al. ...................... | 714/795 |
| 2004/0153953 | A1 * | 8/2004 | Wilson et al. ................ | 714/786 |
| 2009/0052594 | A1 * | 2/2009 | Li et al. ........................ | 375/341 |
| 2011/0131393 | A1 * | 6/2011 | Ramchandran et al. ....... | 712/37 |

* cited by examiner

*Primary Examiner* — Albert Decady
*Assistant Examiner* — Enam Ahmed

(57) ABSTRACT

A Viterbi decoder module includes a branch metric module configured to calculate branch metrics corresponding to a continuous phase modulated signal. Each of the branch metrics corresponds to a respective path between stages of the Viterbi decoder module. A path metric module is configured to calculate a first cost metric associated with the first state of the next stage based on the first branch metric and the second branch metric, and calculate a second cost metric associated with the second state of the next stage based on the third branch metric and the fourth branch metric. A traceback module is configured to determine a maximum likelihood path between stages of the Viterbi decoder based on the first cost metric and the second cost metric. The Viterbi decoder module is configured to output decoded data based on the maximum likelihood path.

19 Claims, 5 Drawing Sheets

VITERBI ARCHITECTURE FOR BDR/BLE

CROSS-REFERENCE TO RELATED APPLICATIONS

This application claims the benefit of U.S. Provisional Application No. 61/578,180, filed on Dec. 20, 2011. The entire disclosure of the above application is incorporated herein by reference.

FIELD

The present disclosure relates to Viterbi decoding for Bluetooth communication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Signals transmitted and received in Gaussian frequency shift keying (GFSK) communication systems (e.g., a Bluetooth network) include a sequence of symbols corresponding to data packets. A device operating in the Bluetooth network includes a receiver (or a transceiver) that receives, for example only, basic data rate (BDR) signals, enhanced data rate (EDR) signals, and/or Bluetooth low energy (BLE) signals including symbols of a corresponding type of data packets. The receiver generally includes a maximum-likelihood decoder such as a Viterbi decoder.

The Viterbi decoder implements a Viterbi algorithm to decode a bitstream (e.g. of data packets) represented by the symbols. For example, a twelve state Viterbi decoder implementing a corresponding twelve state trellis may be used to decode BDR packets. Conversely, an eight state Viterbi decoder implementing an eight state trellis may be used to decode BLE packets. Each state of a corresponding one of the trellises is associated with two branch metrics and respective correlators. The branch metrics correspond to two possible next states (i.e., for respective next bits/symbols). For example, in a twelve state Viterbi decoder, the two branch metrics for each possible current state (i.e., a current bit/symbol) point to two different possible next states out of the remaining eleven states. Conversely, in an eight state Viterbi decoder, the two branch metrics of each current state point to two different possible next state out of the remaining seven states.

The Viterbi decoder correlates the received signal, over the duration of a symbol, to all possible signals using the corresponding trellis to generate correlation values for each branch metric. Accordingly, for a current state, a twelve state Viterbi decoder calculates correlation values for 24 (i.e., two per state) branch metrics and an eight state Viterbi decoder calculates correlation values for 16 branch metrics. Each correlation value corresponds to one of the branch metrics between the current state (a state of a current bit/symbol) and a next state (a state of a next bit/symbol).

Two of the branch metrics point to each subsequent state. Accordingly, each subsequent state has two branch metrics terminating at the subsequent state. Further, each subsequent state has two associated cost metrics. A first cost metric corresponds to a sum of one of the branch metrics (i.e., a first branch metric) terminating at the state and a cost metric of the state the first branch metric originated from. A second cost metric corresponds to a sum of the other of the branch metrics (i.e., a second branch metric) terminating at the state and a cost metric of the state the second branch metric originated from. The greater of the first cost metric and the second cost metric is the cost metric for the subsequent state. In other words, the cost metric having the greater magnitude corresponds to the most likely path (i.e., the path having the maximum likelihood) to the subsequent state.

The cost metric of each subsequent state is calculated after receiving a corresponding symbol. In other words, branch metrics pointing from a first state to a second state are associated with decoding a first received symbol, and branch metrics pointing from the second state to a third state are associated with decoding a second received symbol. After a predetermined number of symbols are received and the corresponding cost metrics for the latest state are calculated (i.e., a traceback depth is reached), the Viterbi decoder selects the latest state having the greatest cost metric, and each previous state having the greatest cost metric in a path leading to the selected state (i.e., a survivor path). The survivor path represents the decoded bits corresponding to the predetermined number of symbols. Each transition from one state to another in a twelve state Viterbi decoder involves calculating and storing correlation values for 24 branch metrics. Conversely, each transition from one state to another in an eight state Viterbi decoder involves calculating and storing correlation values for 16 branch metrics.

Each of BDR signaling and BLE signaling include continuous phase modulated (CPM) signaling. A transmitted CPM signal for a time t, where $nT<t<(n+1)T$, and T is a symbol duration (e.g., 1 μs for BDR and BLE signaling) can be represented as $x(t)=e^{-j(\theta_n+I_nQ(t-nT)+I_{n-1}Q(t-(n-1)T))}$, where $I_n$ is the $n^{th}$ bit transmitted, $I_{n-1}$ is the $(n-1)^{th}$ bit transmitted, $\theta_n$ is an accumulated phase angle prior to transmission of the $n^{th}$ bit, where $\theta_n=\theta_{n-1}+I_{n-2}h\pi n$, and h corresponds to a modulation index (e.g., π/3 for BDR signaling and π/2 for BLE signaling). An ideal signal corresponding to the transmitted signal can be represented as $e^{j(\theta_n+I_nQ(t)+I_{n-1}Q(t+T))}$. For Q(t), $Q(t)=2\pi h\int_0^t g(t)dt$, and g(t), a Gaussian pulse shaping filter, can be represented as $$g(t) = \frac{\sqrt{\pi}}{\alpha} e^{-\left(\frac{\pi t}{\alpha}\right)^2},$$

where $$\alpha = \frac{\sqrt{\ln 2}}{\sqrt{2}} \frac{T}{BT},$$

and B corresponds to 3 dB bandwidth. For example only, for BDR and BLE signaling, 3 dB bandwidth is 500 KHz.

Accordingly, for BDR and BLE signaling, each current state of the Viterbi decoder and corresponding trellis is represented by both an accumulated angle $\theta_n$ (e.g., a multiple of the modulation index π/3 or π/2) and an $(n-1)^{th}$ bit $I_{n-1}$, or $(\theta_n, I_{n-1})$. Each next state of the Viterbi decoder and trellis is represented by a next accumulated angle value $\theta_{n+1}$ and the $n^{th}$ bit, or $(\theta_{n+1}, I_n)$. The bits in BDR and BLE signaling correspond to 1 or −1. An example twelve state trellis 100 corresponding to BDR signaling is shown in FIG. 1A. An example eight state trellis 104 corresponding to BLE signaling is shown in FIG. 1B.

SUMMARY

A Viterbi decoder module includes a branch metric module configured to calculate branch metrics including a first branch metric, a second branch metric, a third branch metric, and a fourth branch metric corresponding to a continuous phase modulated signal. The continuous phase modulated signal corresponds to a basic data rate (BDR) or a Bluetooth low energy (BLE) signal, and each of the branch metrics correspond to a respective path between one of a first state and a second state of a current stage of the Viterbi decoder module, and one of the first state and the second state of a next stage of the Viterbi decoder module. A path metric module is configured to calculate a first cost metric associated with the first state of the next stage based on the first branch metric and the second branch metric, and calculate a second cost metric associated with the second state of the next stage based on the third branch metric and the fourth branch metric. A traceback module is configured to determine a maximum likelihood path between stages of the Viterbi decoder based on the first cost metric and the second cost metric. The Viterbi decoder module is configured to output decoded data based on the maximum likelihood path.

A method of operating a Viterbi decoder includes calculating branch metrics including a first branch metric, a second branch metric, a third branch metric, and a fourth branch metric corresponding to a continuous phase modulated signal. The continuous phase modulated signal corresponds to a basic data rate (BDR) or a Bluetooth low energy (BLE) signal, and each of the branch metrics corresponds to a respective path between one of a first state and a second state of a current stage of the Viterbi decoder and one of the first state and the second state of a next stage of the Viterbi decoder. The method further includes calculating a first cost metric associated with the first state of the next stage based on the first branch metric and the second branch metric, calculating a second cost metric associated with the second state of the next stage based on the third branch metric and the fourth branch metric, determining a maximum likelihood path between stages of the Viterbi decoder based on the first cost metric and the second cost metric, and outputting decoded data based on the maximum likelihood path.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

A device configured to operate in a Bluetooth network includes a transmitter and a receiver (or, a transceiver) for transmitting and receiving Bluetooth signals. For Bluetooth communication including, for example only, basic data rate (BDR) signaling and/or Bluetooth low energy (BLE) signaling, the receiver may include a Viterbi decoder. Further, BDR and BLE signaling correspond to a relatively high number of Viterbi decoder (and trellis) states. For example, BRD and BLE signaling require twelve and eight states, respectively. In a Viterbi decoder, a greater number of states and associated branch metrics corresponds to increased computational complexity and cost, which further corresponds to, for example, increased hardware and increased power consumption.

In the Viterbi architecture according to the principles of the present disclosure, a Viterbi decoder reduces the number of states required for decoding, for example, BDR signals and BLE signals. For example only, the Viterbi decoder according to the present disclosure is configurable to decode both BDR and BLE signals using two states instead of twelve and eight, respectively.

Figure 1:
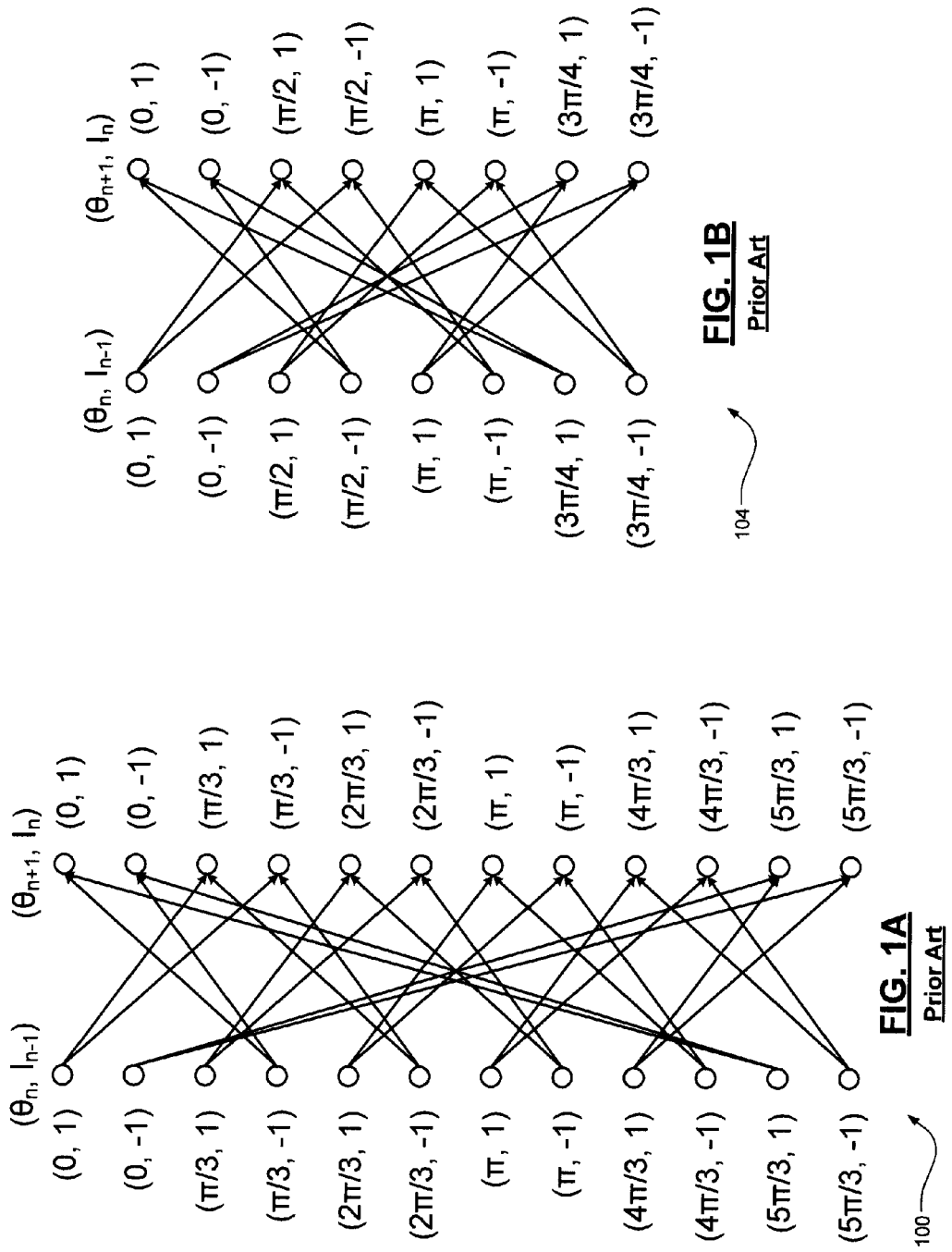
FIG. 1A illustrates a twelve state BDR trellis according to the prior art.
FIG. 1B illustrates an eight state BLE trellis according to the prior art.
Figure 2:
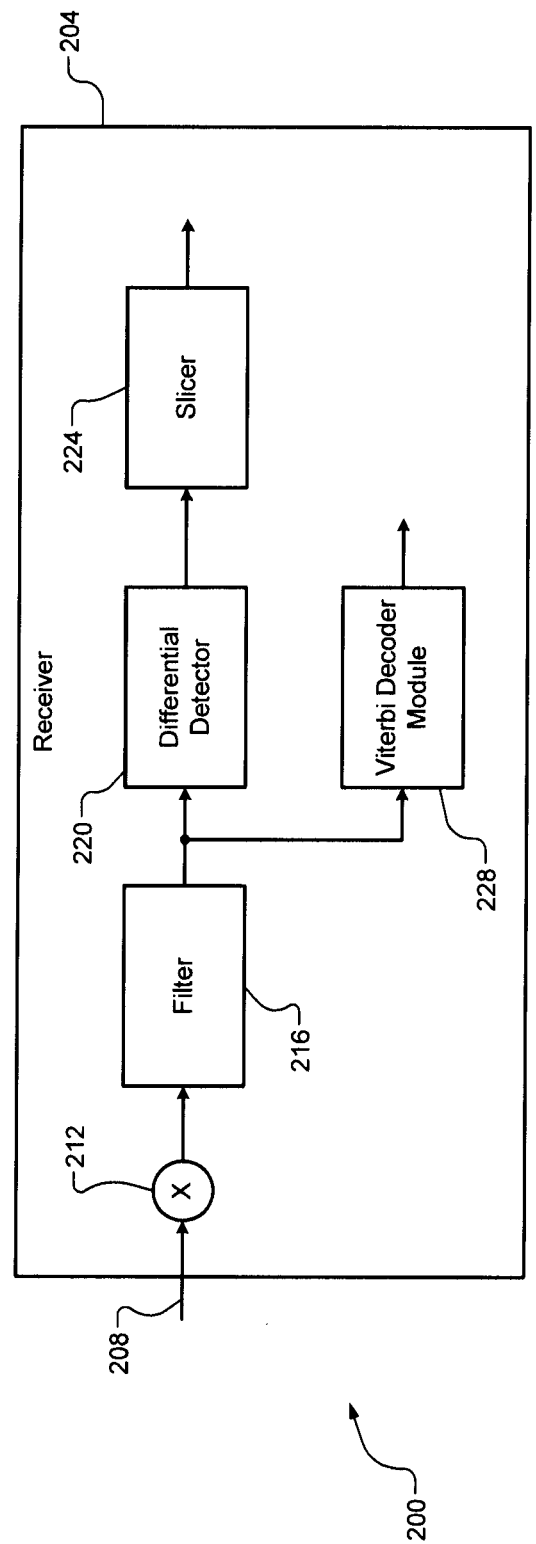
FIG. 2 is a functional block diagram of a device including a two state Viterbi decoder module according to the principles of the present disclosure.

In FIG. 2, a device 200 is configured to transmit and receive Bluetooth signals including, but not limited to BDR signals and BLE signals. The device 200 includes a receiver 204. The receiver 204 receives a signal 208, which may include a BDR signal and/or a BLE signal. The signal 208 is downconverted by a downconverter 212 and provided to a filter 216 (e.g., a low pass filter). The filter 216 provides a filtered signal r(t) to a differential detector 220, which communicates with a slicer 224. The filter 216 also provides the signal r(t) to a Viterbi decoder module 228.

For example only, the signal r(t) is complex and is provided to the Viterbi decoder module 228 at 8 Msps. The Viterbi decoder module 228 has two states, each having two associated branch metrics, for a total of four branch metrics. The Viterbi decoder module 228 calculates a corresponding ideal signal for each of the branch metrics and stores the ideal signals for a predetermined period (e.g., 1 μs). The ideal signal for correlation of each of the branch metrics may be represented as $e^{j(I_n Q(t) + I_{n-1} Q(t+T))}$, where $Q(t) = 2\pi h \int_0^t g(t) dt$, and g(t) corresponds to the Gaussian pulse shaping filter for BDR signaling and BLE signaling. In other words, instead of an ideal signal represented as $e^{j(\theta_n + I_n Q(t) + I_{n-1} Q(t+T))}$ as described for the twelve state BDR Viterbi decoder/trellis and the eight state BLE Viterbi decoder/trellis, the ideal signal used for correlation in the two state Viterbi decoder module according to the principles of the present disclosure is represented as $e^{j(I_n Q(t) + I_{n+1} Q(t+T))}$.

Figure 3:
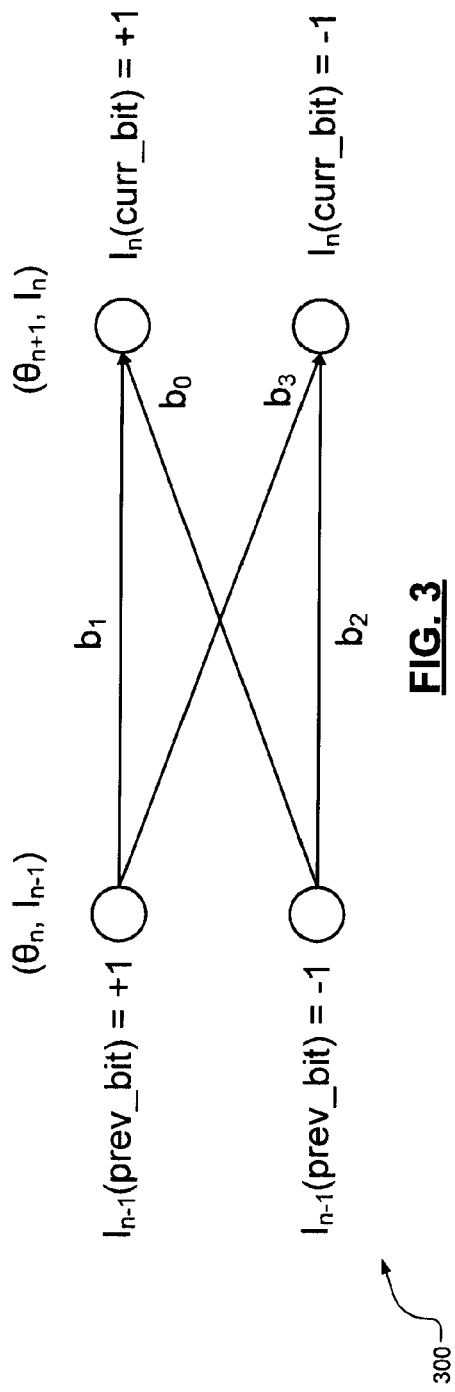
FIG. 3 illustrates a two state trellis according to the principles of the present disclosure.

In FIG. 3, a two state trellis 300 corresponding to the Viterbi decoder module 228 includes branches (i.e., branch metrics) $b_0$, $b_1$, $b_2$, and $b_3$. A current stage of the trellis 300 include a first state $I_{n-1}(\text{prev\_bit}) = 1$ (i.e., a previous bit was decoded as a 1) and a second state $I_{n-1}(\text{prev\_bit}) = -1$ (i.e., a previous bit was decoded as a −1). A next stage of the trellis 300 include a first state $I_n(\text{curr\_bit}) = 1$ (i.e., a current bit is a 1) and a second state $I_n(\text{curr\_bit}) = -1$ (i.e., a current bit is a −1). Assuming eight samples per symbol (i.e., bit) and a sampling instant idx, an array of the ideal signals can be represented as corr_sig[branch_no][idx], where 0≤idx<8, and "branch_no" can be 1, 2, 3, or 4, corresponding to branch $b_0$, $b_1$, $b_2$, or $b_3$, respectively.

Figure 4:
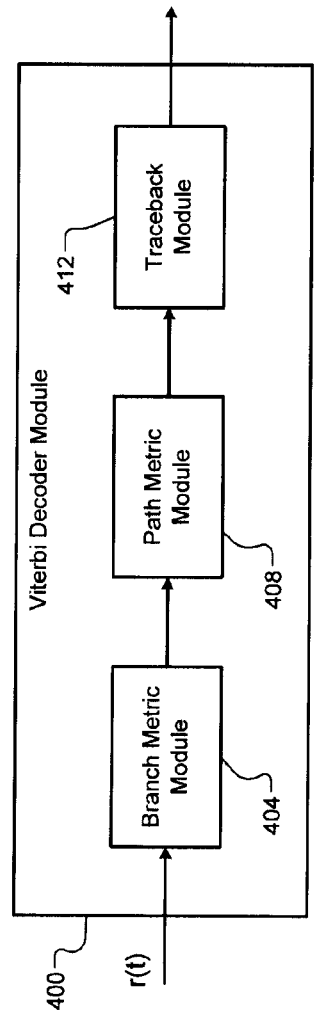
FIG. 4 is a functional block diagram of a two state Viterbi decoder module according to the principles of the present disclosure.

In FIG. 4, an example two state Viterbi decoder module 400 includes a branch metric module 404, a path metric module 408, a traceback module 412. The branch metric module 404 calculates the branch metrics (i.e., four branch metrics, two per state, for each stage of the Viterbi decoder module 400) for the signal r(t). The path metric module 408 calculates the best, or optimal, survivor paths for each state, which corresponds to the paths having the highest cost metric into each respective state. The traceback module 412 restores a maximum-likelihood path based on the survivor paths calculated by the path metric module 408.

Figure 5:
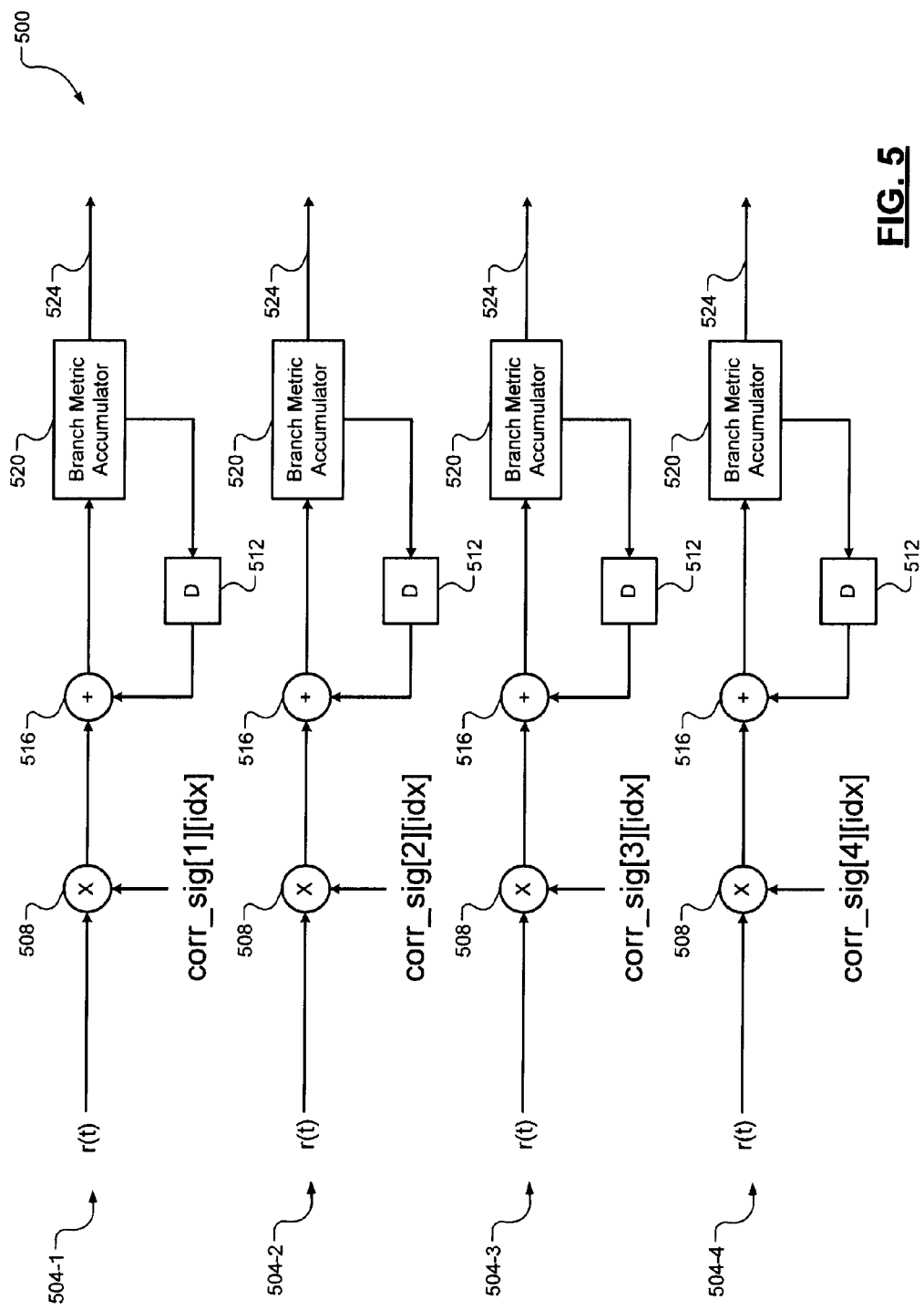
FIG. 5 illustrates a branch metric module according to the principles of the present disclosure.

In FIG. 5, an example branch metric module 500 includes branch metric paths 504-1, 504-2, 504-3, and 504-4, referred to collectively as branch metric paths 504, for each of the respective four branch metrics. Each of the paths 504 receives a sample of the signal r(t) at idx. For example only, the received signal is sampled eight times over the duration of 1 μs, or at 8 MHz, for eight samples of r(t). The samples are correlated to the corresponding ideal signal, which also has a 1 μs duration, by multiplying each sample by the ideal signal at multiplier 508 and summing the result with an accumulated sum of previous multiplications. For example, the result of the multiplication is summed with the output of delay element 512 at summer 516 and provided to a branch metric accumulator 520. The branch metric accumulator 520 accumulates each of the samples (e.g., eight samples) over the sample period and outputs a final branch metric 524. For example only, the branch metric for a branch b corresponds to $$\sum_{idx=0}^{7} r[idx] *$$

corr_sig[b][idx].

Each of the states of the trellis 300 shown in FIG. 3 can be reached via two paths. For example, the first state $I_n$(curr_bit) =1 can be reached via the branch $b_0$ or the branch $b_1$. Accordingly, the cost metrics of the first state depend on the branch metrics calculated for each of the branches $b_0$ and $b_1$. Conversely, the second state $I_n$(curr_bit)=−1 can be reach via the branch $b_2$ or the branch $b_3$. Accordingly, the cost metrics of the second state depend on the branch metrics calculated for each of the branches $b_2$ and $b_3$.

Figure 6:
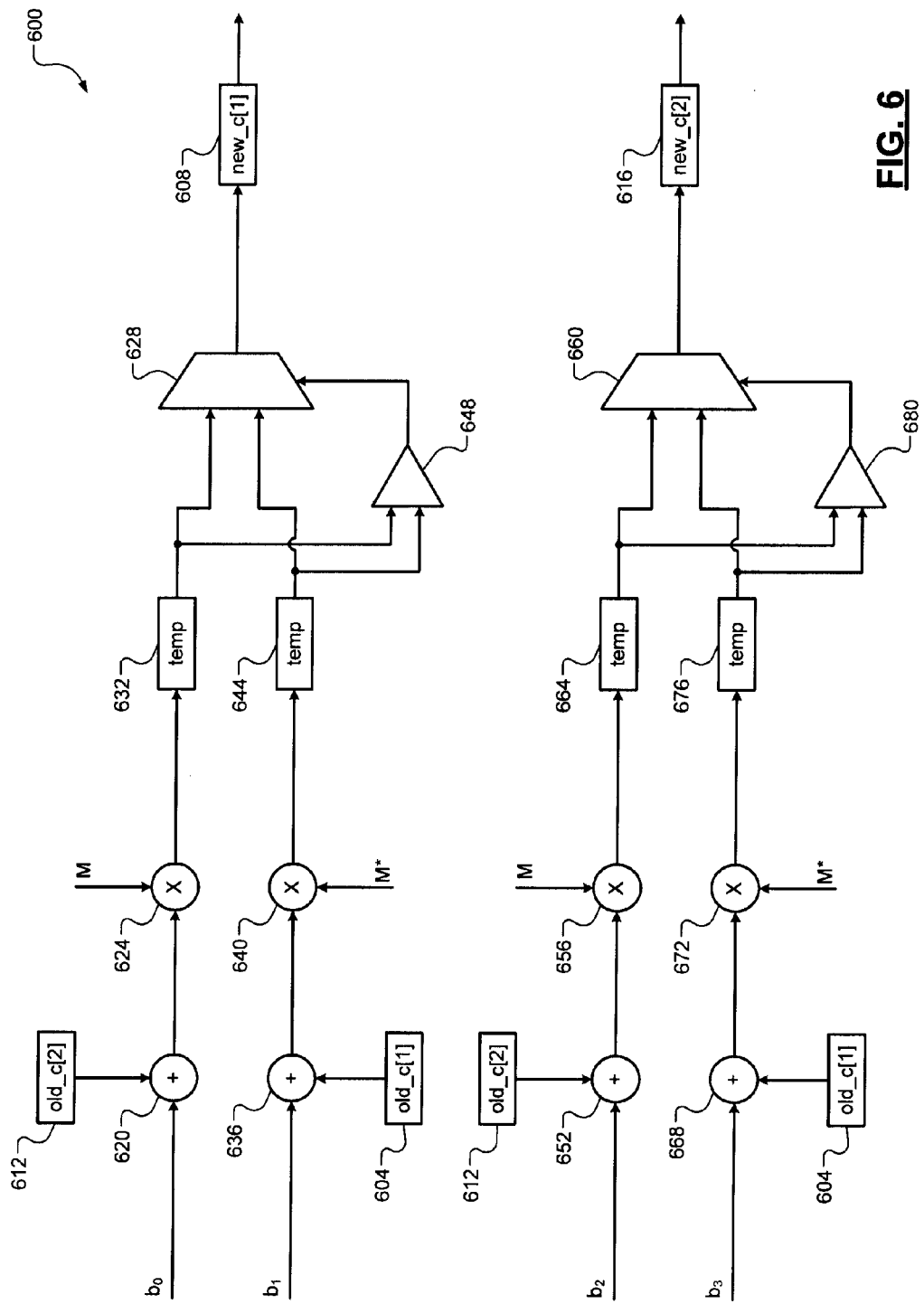
FIG. 6 illustrates a path metric module according to the principles of the present disclosure.

In FIG. 6, an example path metric module 600 calculates and stores two cost metrics for each state of the trellis 300. The two cost metrics include an old cost metric old_c [state_no] for the state and a new cost metric new_c[state_no] for the state, where "state_no" is a 1 or a 2 to identify the state. For example only, the cost metric values of old_c[1], new_c [1], old_c[2], and new_c[2] are stored in respective registers 604, 608, 612, and 616. The registers 604, 608, 612, and 616 may be updated at 1 MHz.

For each new cost metric corresponding to a state, the two possible corresponding branch metrics terminating at the state are summed with respective old cost metric values, multiplied by a programmable multiplier M, and compared to one another to determine the new cost metric for the state. For example, for state 1, the branch metric $b_0$ is summed with the old cost metric for state 2 at summer 620, multiplied by the programmable multiplier M at multiplier 624, and provided to multiplexer 628. The output of the summer 620 may be stored in a temporary register 632. Conversely, the branch metric $b_1$ is summed with the old cost metric for state 1 at summer 636, multiplied by M* (the conjugate of the programmable multiplier M) at multiplier 640, and provided to the multiplexer 628. The output of the summer 620 may be stored in a temporary register 644.

The values stored in the registers 632 and 644 are also provided to a comparator 648, which selects an output of the multiplexer 628. For example, if the value stored in the register 632 is greater, then the multiplexer 628 outputs the value stored in the register 632. Conversely, if the value stored in the register 644 is greater, then the multiplexer 628 outputs the value stored in the register 644. Accordingly, the multiplexer 628 outputs a new cost metric corresponding to the greater of the cost metrics associated with the branch metric $b_0$ and the branch metric $b_1$, which is stored as the new cost metric new_c[1] in the register 616.

Conversely, for state 2, the branch metric $b_2$ is summed with the old cost metric for state 2 at summer 652, multiplied by the programmable multiplier M at multiplier 656, and provided to multiplexer 660. The output of the summer 652 may be stored in a temporary register 664. Conversely, the branch metric $b_3$ is summed with the old cost metric for state 1 at summer 668, multiplied by M* at multiplier 672, and provided to the multiplexer 660. The output of the summer 668 may be stored in a temporary register 676.

The values stored in the registers 664 and 676 are also provided to a comparator 680, which selects an output of the multiplexer 660. For example, if the value stored in the register 664 is greater, then the multiplexer 660 outputs the value stored in the register 664. Conversely, if the value stored in the register 676 is greater, then the multiplexer 660 outputs the value stored in the register 676. Accordingly, the multiplexer 660 outputs a new cost metric corresponding to the greater of the cost metrics associated with the branch metric $b_2$ and the branch metric $b_3$, which is stored as the new cost metric new_c[2] in the register 608. For subsequent states, the values stored in the registers 608 and 616 are copied to the registers 604 and 612. In other words, the current new cost metrics become the old cost metrics for the subsequent states.

The programmable multiplier M (M*, the conjugate of the programmable multiplier M) is based on the modulation index of the received signal 208. In particular, the programmable multiplier M is adjusted based on whether the signal corresponds to BDR signaling or BLE signaling. Accordingly, the same Viterbi decoder module 400 and corresponding branch metric module 500 and path metric module 600 can be used to decode both BDR signals and BLE signals by adjusting the programmable multiplier. For example, for BDR signaling, $$M = e^{\left(j*\frac{\pi}{3}\right)}.$$

Conversely, for BLE signaling, $$, M = e^{\left(j*\frac{\pi}{2}\right)}.$$

For example only, the Viterbi decoder module 400 or another component of the device 200 may determine whether BDR or BLE signaling is being used and adjust the programmable multiplier M (and M*) accordingly.

In one implementation, Viterbi decoding is performed on a data portion of BDR and BLE packets, and a preamble, access code, tail, and header portion of the BDR packets are decoded using, for example only, the differential detector 220 as shown in FIG. 2. Conversely, for EDR packets, the entire packet may be decoded using the differential detector 220. For example only, the header portion of a packet indicates whether the packet is a BDR packet, a BLE packet, or an EDR packet. After decoding the header portion, the receiver 204 determines whether to switch to Viterbi decoding based on the packet type. If the header portion indicates that the packet is a BDR or BLE packet, then the receiver 204 switches to Viterbi decoding, and adjusts the programmable multiplier M accordingly.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); a discrete circuit; an integrated circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:

1. A Viterbi decoder module, comprising:
a branch metric module configured to calculate branch metrics including a first branch metric, a second branch metric, a third branch metric, and a fourth branch metric corresponding to a continuous phase modulated signal, wherein the continuous phase modulated signal corresponds to a basic data rate (BDR) or a Bluetooth low energy (BLE) signal, wherein each of the branch metrics corresponds to a respective path between i) one of a first state and a second state of a current stage of the Viterbi decoder module, and ii) one of the first state and the second state of a next stage of the Viterbi decoder module, and wherein each of the current stage and the next stage of the Viterbi decoder module includes only the first state and the second state;
a path metric module configured to i) calculate a first cost metric associated with the first state of the next stage based on the first branch metric and the second branch metric, and ii) calculate a second cost metric associated with the second state of the next stage based on the third branch metric and the fourth branch metric; and
a traceback module configured to determine a maximum likelihood path between stages of the Viterbi decoder based on the first cost metric and the second cost metric, wherein the Viterbi decoder module is configured to output decoded data based on the maximum likelihood path.

2. The Viterbi decoder module of claim 1, wherein the branch metric module is configured to correlate samples of the continuous phase modulated signal to ideal signals associated with each of the branch metrics to calculate the first branch metric, the second branch metric, the third branch metric, and the fourth branch metric.

3. The Viterbi decoder module of claim 2, wherein the ideal signals correspond to $e^{j(I_n Q(t) + I_{n-1} Q(t+T))}$, $Q(t) = 2\pi h \int_0^t g(t)\,dt$, $g(t)$ corresponds to a Gaussian pulse shaping filter, t is a sample time, $nT<t<(n+1)T$, T is a duration of a symbol of the continuous phase modulated signal, $I_n$ is an $n^{th}$ bit of the continuous phase modulated signal, and $I_{n-1}$ is an $(n-1)^{th}$ bit of the continuous phase modulated signal.

4. A Viterbi decoder module, comprising:
a branch metric module configured to calculate branch metrics including a first branch metric, a second branch metric, a third branch metric, and a fourth branch metric corresponding to a continuous phase modulated signal, wherein the continuous phase modulated signal corresponds to a basic data rate (BDR) or a Bluetooth low energy (BLE) signal, and wherein each of the branch metrics corresponds to a respective path between i) one of a first state and a second state of a current stage of the Viterbi decoder module, and ii) one of the first state and the second state of a next stage of the Viterbi decoder module;
a path metric module configured to i) calculate a first cost metric associated with the first state of the next stage based on the first branch metric and the second branch metric, and ii) calculate a second cost metric associated with the second state of the next stage based on the third branch metric and the fourth branch metric; and
a traceback module configured to determine a maximum likelihood path between stages of the Viterbi decoder based on the first cost metric and the second cost metric, wherein the Viterbi decoder module is configured to output decoded data based on the maximum likelihood path,
wherein the path metric module is further configured to:
calculate a first sum of the first branch metric and a previous cost metric associated with the second state of the current stage, calculate a second sum of the second branch metric and a previous cost metric associated with the first state of the current stage, and calculate the first cost metric based on a greater one of the first sum and the second sum; and
calculate a third sum of the third branch metric and the previous cost metric associated with the second state of the current stage, calculate a fourth sum of the fourth branch metric and the previous cost metric associated with the first state of the current stage, and calculate the second cost metric based on a greater one of the third sum and the fourth sum.

5. The Viterbi decoder module of claim 4, wherein the path metric module is configured to multiply each of the first sum, the second sum, the third sum, and the fourth sum by one of a programmable multiplier and a conjugate of the programmable multiplier, wherein the one of the programmable multiplier and the conjugate of the programmable multiplier is based on a modulation index of the continuous phase modulated signal.

6. The Viterbi decoder module of claim 5, wherein the one of the programmable multiplier and the conjugate of the programmable multiplier i) is a first value when the continuous phase modulated signal includes corresponds to the BDR signal, and ii) is a second value when the continuous phase modulated signal corresponds to the BLE signal.

7. The Viterbi decoder module of claim 6, wherein the first value is $$e^{(j*\frac{\pi}{2})}$$

and the second value is $$e^{(j*\frac{\pi}{2})}.$$

8. The Viterbi decoder module of claim 6, wherein the Viterbi decoder module is configured to i) determine whether the continuous phase modulated signal corresponds to the BDR signal or the BLE signal, and ii) select one of the first value and the second value as the programmable multiplier based on the determination.

9. A receiver for a device configured to operate in a Bluetooth network, the receiver comprising:
the Viterbi decoder module of claim 1.

10. The receiver of claim 9, wherein the Viterbi decoder module is configured to output the decoded data based on a first portion of the continuous phase modulated signal, the receiver further comprising:
a differential detector configured to decode a second portion of the continuous phase modulated signal.

11. A method of operating a Viterbi decoder, the method comprising:
calculating branch metrics including a first branch metric, a second branch metric, a third branch metric, and a fourth branch metric corresponding to a continuous phase modulated signal, wherein the continuous phase modulated signal corresponds to a basic data rate (BDR) or a Bluetooth low energy (BLE) signal, wherein each of the branch metrics corresponds to a respective path between i) one of a first state and a second state of a current stage of the Viterbi decoder, and ii) one of the first state and the second state of a next stage of the Viterbi decoder, and wherein each of the current stage and the next stage of the Viterbi decoder module includes only the first state and the second state;
calculating a first cost metric associated with the first state of the next stage based on the first branch metric and the second branch metric;
calculating a second cost metric associated with the second state of the next stage based on the third branch metric and the fourth branch metric;
determining a maximum likelihood path between stages of the Viterbi decoder based on the first cost metric and the second cost metric; and
outputting decoded data based on the maximum likelihood path.

12. The method of claim 11, further comprising correlating samples of the continuous phase modulated signal to ideal signals associated with each of the branch metrics to calculate the first branch metric, the second branch metric, the third branch metric, and the fourth branch metric.

13. The method of claim 12, wherein the ideal signals correspond to $$e^{j(I_n Q(t) + I_{n-1} Q(t+T))}, \; Q(t) = 2\pi h \int_0^t g(t)\,dt, \; g(t)$$

corresponds to a Gaussian pulse shaping filter, t is a sample time, $nT < t < (n+1)T$, T is a duration of a symbol of the continuous phase modulated signal, $I_n$ is an $n^{th}$ bit of the continuous phase modulated signal, and $I_{n-1}$ is an $(n-1)^{th}$ bit of the continuous phase modulated signal.

14. A method of operating a Viterbi decoder, the method comprising:
calculating branch metrics including a first branch metric, a second branch metric, a third branch metric, and a fourth branch metric corresponding to a continuous phase modulated signal, wherein the continuous phase modulated signal corresponds to a basic data rate (BDR) or a Bluetooth low energy (BLE) signal, and wherein each of the branch metrics corresponds to a respective path between i) one of a first state and a second state of a current stage of the Viterbi decoder, and ii) one of the first state and the second state of a next stage of the Viterbi decoder;
calculating a first cost metric associated with the first state of the next stage based on the first branch metric and the second branch metric;
calculating a second cost metric associated with the second state of the next stage based on the third branch metric and the fourth branch metric;
determining a maximum likelihood path between stages of the Viterbi decoder based on the first cost metric and the second cost metric;
outputting decoded data based on the maximum likelihood path;
calculating a first sum of the first branch metric and a previous cost metric associated with the second state of the current stage;
calculating a second sum of the second branch metric and a previous cost metric associated with the first state of the current stage;
calculating the first cost metric based on a greater one of the first sum and the second sum;
calculating a third sum of the third branch metric and the previous cost metric associated with the second state of the current stage;
calculating a fourth sum of the fourth branch metric and the previous cost metric associated with the first state of the current stage; and
calculating the second cost metric based on a greater one of the third sum and the fourth sum.

15. The method of claim 14, further comprising multiplying each of the first sum, the second sum, the third sum, and the fourth sum by one of a programmable multiplier and a conjugate of the programmable multiplier, wherein the one of the programmable multiplier and the conjugate of the programmable multiplier is based on a modulation index of the continuous phase modulated signal.

16. The method of claim 15, wherein the one of the programmable multiplier and the conjugate of the programmable multiplier i) is a first value when the continuous phase modulated signal includes corresponds to the BDR signal, and ii) is a second value when the continuous phase modulated signal corresponds to the BLE signal.

17. The method of claim 16, wherein the first value is $$e^{\left(j*\frac{\pi}{2}\right)}$$

and the second value $$e^{\left(j*\frac{\pi}{2}\right)}.$$

18. The method of claim 16, further comprising:
determining whether the continuous phase modulated signal corresponds to the BDR signal or the BLE signal; and
selecting one of the first value and the second value as the programmable multiplier based on the determination.

19. The method of claim 11, further comprising:
outputting the decoded data based on a first portion of the continuous phase modulated signal; and
decoding a second portion of the continuous phase modulated signal.

* * * * *